United States Patent [19]

Holmes et al.

[11] 4,153,518
[45] May 8, 1979

[54] METHOD OF MAKING A METALIZED SUBSTRATE HAVING A THIN FILM BARRIER LAYER

[75] Inventors: Robert E. Holmes, Portland; Robert R. Zimmerman, Beaverton, both of Oreg.

[73] Assignee: Tektronix, Inc., Beaverton, Oreg.

[21] Appl. No.: 852,991

[22] Filed: Nov. 18, 1977

[51] Int. Cl.² .............................................. C25D 5/54
[52] U.S. Cl. .............................. 204/38 B; 204/38 R; 427/99; 427/124; 427/125; 427/126; 428/630; 428/633
[58] Field of Search ............ 204/38 R, 38 B; 427/96, 427/99, 123-126, 250, 294, 404

[56] References Cited

U.S. PATENT DOCUMENTS

| | | | |
|---|---|---|---|
| 3,106,489 | 10/1963 | Lepselter | 204/38 B |
| 3,564,353 | 2/1971 | Corak et al. | 427/126 |
| 3,890,177 | 6/1975 | Pfahnl et al. | 427/99 |
| 3,922,387 | 11/1975 | Larry | 427/126 |
| 3,950,586 | 4/1976 | Davey | 427/96 |
| 3,982,218 | 9/1976 | Adler et al. | 204/38 B |

*Primary Examiner*—T. Tung
*Assistant Examiner*—William Leader
*Attorney, Agent, or Firm*—George T. Noe

[57] ABSTRACT

A method of fabricating a hybrid circuit including a siliceous substrate and thick metal conductors. A thin film barrier layer is provided intermediate the substrate and a vacuum-deposited metal layer, which metal layer is subsequently electroplated to provide the desired metal thickness. The barrier layer, which may suitably be a refractory metal oxide such as the oxides of zirconium, tantalum, titanium, or tungsten, prevents loss of adhesion between the vacuum deposited metal and substrate that occurs during electroplating.

3 Claims, 2 Drawing Figures

METHOD OF MAKING A METALIZED SUBSTRATE HAVING A THIN FILM BARRIER LAYER

BACKGROUND OF THE INVENTION

The subject matter of the present invention relates generally to forming a metal layer on a siliceous substrate, and more particularly to forming a metal layer on a siliceous substrate by first vacuum depositing a thin metal layer and then electroplating to provide the desired metal thickness.

Numerous methods have been disclosed in the prior art to provide a metalized layer on substrates having a high silica content, such as fused silica, glass, or quartz. One of the more common methods has been by vacuum deposition, which, while providing a satisfactory bonded metallic layer to the substrate, is a time consuming and expensive process. For vacuum depositing conductive metals such as gold, or even copper, it is known to first vacuum deposit a thin layer of oxide forming metal, such as chromium, tantalum, titanium, or nichrome, which reacts with the surface of the siliceous substrate to form a reliable bond therebetween. The layer of oxide-forming metal need only be on the order of 200 Angstroms in thickness. Thereafter, while still in the evacuated environment, the gold or other conductive metal is deposited thereon to the desired thickness.

In the fabrication of hybrid circuits, the above-outlined procedure has been utilized to provide a metalized layer on siliceous substrates to form the basis for metal conductors and pads. An etching process is utilized to remove the undesired portions of the metalized layer, leaving only the conductors and pads. However, the etching is difficult to control, particularly in microcircuit applications where close tolerances are necessary. Additionally, if a precious metal such as gold is used for the metalized layer, an additional process is required to recover the removed metal from the etchant.

It has long been recognized by investigators in the art that it would be desirable to vacuum deposit on a siliceous substrate a thin metal layer, and then electroplate the metal layer to the desired thickness. Not only is such a process more simple and inexpensive, but extremely close tolerances of conductors and pads may be maintained. However, attempts to carry out this process have resulted in a loss of adhesion between the vacuum deposited metal and substrate during the electroplating process.

SUMMARY OF THE INVENTION

The present invention is a method of fabricating a hybrid circuit including a siliceous substrate and thick metal conductors and pads by electroplating. A thin film barrier layer is provided intermediate the substrate and a vacuum-deposited metal layer to prevent reaction therebetween, and the attendant loss of adhesion between the metal layer and the substrate, during the electroplating process. Thus a more simple and inexpensive fabrication method for hybrid circuits than heretofore achieved may be attained, and extremely close tolerances of metal conductors and pads may be maintained.

It is therefore one object of the present invention to provide a method of fabricating a hybrid circuit including a siliceous substrate and thick metal conductors and pads by electroplating.

It is another object to provide a thin film barrier layer intermediate a substrate and a thin vacuum deposited metal layer to prevent a reaction therebetween, and attendant loss of adhesion between the metal layer and the substrate, during the electroplating process.

It is a further object to provide a method of fabricating a hybrid circuit including a siliceous substrate and thick metal conductors which is simple and inexpensive.

It is an additional object to provide a method of fabricating a hybrid circuit including a siliceous substrate and thick metal conductors in which the tolerances of physical dimensions may be closely maintained.

It is yet another object to provide a process for fabricating high-resolution microwave hybrid circuits using electroformed gold conductors.

It is yet an additional object to provide a process for fabrication of thin thermal printer on a siliceous or low-thermal-conductivity substrate using thin film resistive elements and electroplated conductors.

Other objects and attainments of the present invention will become apparent to those skilled in the art upon a reading of the following detailed description when taken in conjunction with the accompanying drawings.

DETAILED DESCRIPTION

Figure 1:
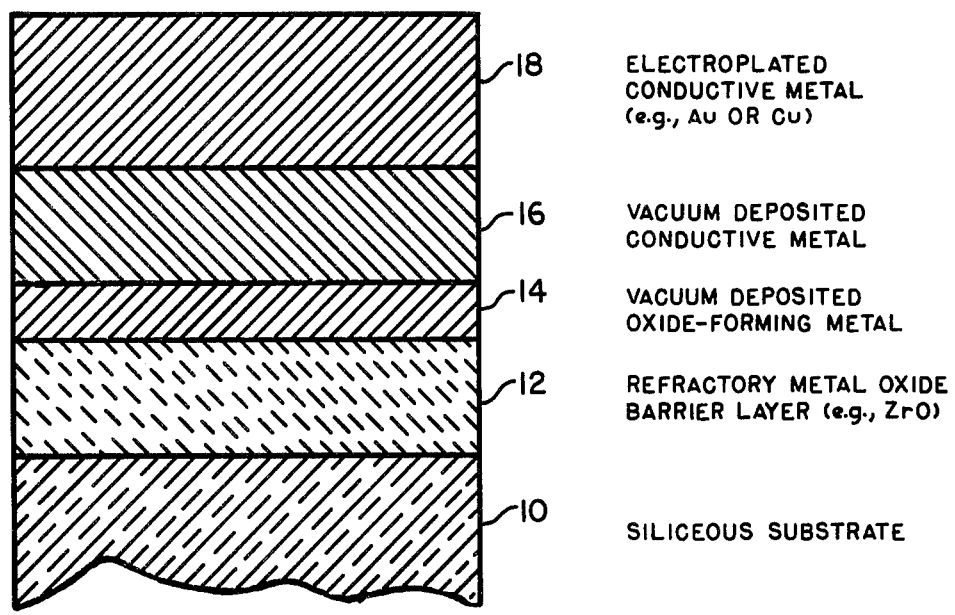
FIG. 1 is a cross-sectional view of one embodiment of a hybrid circuit in accordance with the present invention.

In FIG. 1 is shown a cross-sectional view of one embodiment of a hybrid circuit fabricated in accordance with the present invention. A siliceous base or substrate 10 comprises a high silica content material such as quartz, fused silica, glass, or the like. Deposited on substrate 10 is a thin dielectric film or barrier layer 12 of a refractory metal oxide. Bonded to the barrier layer 12 is a vacuum deposited layer 14 of oxide-forming metal, such as chromium, titanium, or tantalum, of from about 200 to 1,000 Angstroms, and then bonded to the oxide-forming metal is a vacuum deposited layer 16 of highly conductive metal, such as gold or copper of from about 1,000 to 10,000 Angstroms. The layers 14 and 16 of oxide-forming and conductive metals respectively are utilized in prior art hybrid circuits, and thus may be vacuum deposited by any of several known conventional techniques. Finally, a layer 18 of highly conductive metal, such as gold or copper, is bonded to the vacuum deposited metal by electroplating to the desired thickness, for example, 10 microns.

The barrier layer 12 prevents the silica and vacuum deposited metal from reacting during the electroplating process, which reaction would result in a loss of adhesion between the vacuum deposited metal and the substrate. Further, the barrier layer prevents chemical etchants from attacking the siliceous substrate. It has been found that a refractory metal oxide film having a thickness of about 2,000 Angstroms provides a sufficient barrier layer to prevent the aforementioned undesired reactions. The refractory metal oxide barrier layer is also an insulating film having electrical properties not detrimental to hybrid circuits. The refractory metal oxide suitably may be zirconium oxide, which may be deposited by any of several known methods. For example, zirconium may be deposited by vacuum evaporation, by sputtering, or by chemical vapor deposition, and then subsequently oxidized. Or the zirconium reactively may be evaporated or sputtered in a partially oxygen ambient to provide the zirconium oxide, or zirconium oxide may be evaporated, sputtered, or chemical vapor deposited directly. While zirconium oxide has been utilized in the present invention to provide the barrier layer, the oxides of other refractory metals, such as tantalum, titanium, or tungsten, may also be utilized.

The use of the refractory metal oxide barrier layer 12 permits the fabrication of hybrid circuits on high silica content substrates using standard thin film processing techniques. For example, a pattern mask defining conductors and pads may be laid down on the vacuum deposited metals, and such conductors and pads may be electroplated to the desired thickness. Then, of course, the pattern mask is removed, and an etching process may be used to remove the unwanted thin vacuum deposited metal layers that would exist between the conductors. The expense of such a process may be minimized by providing the vacuum deposited metal layers 14 and 16 as thin as practicable, for example, about 200 Angstroms for the chromium layer and about 1,000 Angstroms for the vacuum deposited gold layer. Further, the pattern mask may be laid down directly on the barrier layer prior to vacuum deposition so that the etchant step may be eliminated altogether. The use of the pattern mask for the electroplating process permits a high degree of control of dimension tolerances of the electroplated conductors to be attained.

Figure 2:
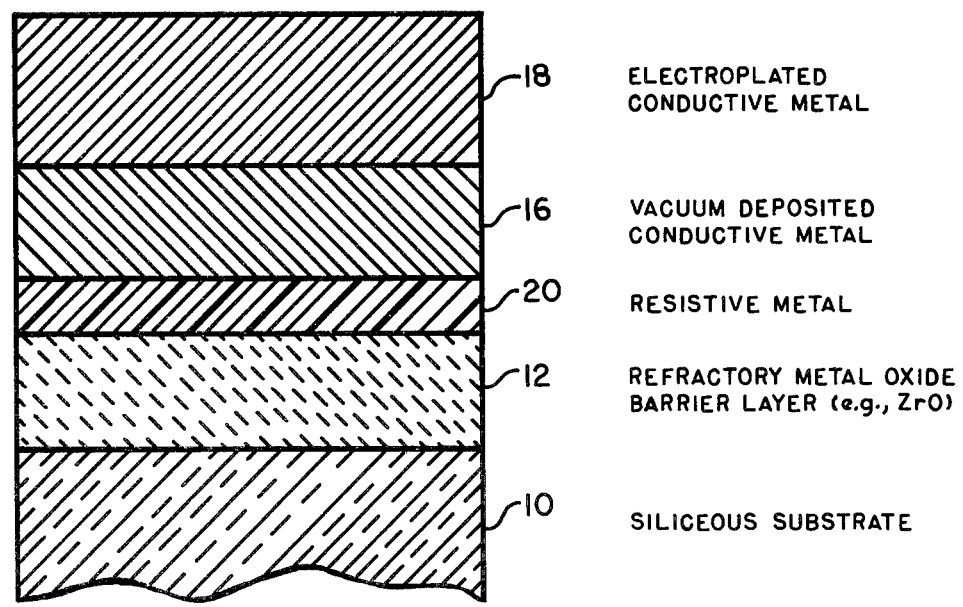
FIG. 2 is a cross-sectional view of an additional embodiment of a hybrid circuit in accordance with the present invention.

FIG. 2 shows a similar embodiment employing the refractory metal oxide dielectric barrier layer as described hereinabove; however, the oxide-forming metal layer 14 of FIG. 1 is replaced with a film 20 of resistive metal, such as nichrome.

Thus, thermal print heads, microwave hybrid circuits, and the like may be fabricated utilizing the processes and techniques described hereinabove.

In summary, a thin film barrier layer is provided intermediate a siliceous substrate and a vacuum deposited metal layer, which metal layer is subsequently electroplated to provide the desired metal thickness. Conventional thin film processing techniques may be employed to provide a simple and inexpensive fabrication method for hybrid circuits.

It will be obvious to those having ordinary skill in the art that many changes may be made in the above-described details of the preferred embodiments of the present invention without departing from the spirit of the present invention. Therefore, the scope of the present invention should only be determined by the following claims.

What we claim as being novel is:

1. A process of fabricating hybrid circuits on a siliceous substrate, comprising:
   depositing on said substrate a barrier layer of a refractory metal oxide to prevent loss of adhesion between the adjacent overlying layer and said substrate during a subsequent electrodeposition step;
   vacuum depositing from about 200 to 1,000 Angstroms of an oxide-forming metal selected from the group consisting of chromium, titanium, and tantalum on said refractory metal oxide layer;
   vacuum depositing from about 1,000 to 10,000 Angstroms of conductive metal on said oxide-forming metal; and
   electroplating a layer of conductive metal on said vacuum deposited conductive metal.

2. A process in accordance with claim 1 wherein said refractory metal oxide is zirconium oxide.

3. A process in accordance with claim 2 wherein said zirconium oxide layer is about 2,000 Angstroms thick.

* * * * *

UNITED STATES PATENT AND TRADEMARK OFFICE
CERTIFICATE OF CORRECTION

PATENT NO. : 4,153,518

DATED : May 8, 1979

INVENTOR(S) : ROBERT EUGENE HOLMES/ROBERT RAND ZIMMERMAN

It is certified that error appears in the above-identified patent and that said Letters Patent are hereby corrected as shown below:

Col. 2, Line 17, "thin thermal" should be --thin film thermal--

Signed and Sealed this

Thirtieth Day of October 1979

[SEAL]

Attest:

RUTH C. MASON
Attesting Officer

LUTRELLE F. PARKER
Acting Commissioner of Patents and Trademarks